United States Patent [19]
Linn

[11] 4,085,452
[45] Apr. 18, 1978

[54] MAGNETIC DOMAIN MEMORY EMPLOYING ALL-BUBBLE LOGIC ELEMENTS

[75] Inventor: John Charles Linn, Richardson, Tex.

[73] Assignee: Texas Instruments Incorporated, Dallas, Tex.

[21] Appl. No.: 469,493

[22] Filed: May 13, 1974

[51] Int. Cl.² ............................................. G11C 19/08
[52] U.S. Cl. ......................................... 365/5; 365/13
[58] Field of Search ................. 340/174 TF, 174 SR

[56] References Cited
U.S. PATENT DOCUMENTS

| | | | |
|---|---|---|---|
| 3,743,788 | 7/1973 | Krupp et al. | 340/174 TF |
| 3,750,106 | 7/1973 | Caron | 340/174 TF |
| 3,824,567 | 7/1974 | Sakalay | 340/174 TF |

OTHER PUBLICATIONS
IBM Tech. Disc. Bull., "Angelfish Logical Connectives for Bubble Domains," by Almasi et al., vol. 13, No. 10, 3/71.

Primary Examiner—James W. Moffitt
Attorney, Agent, or Firm—James T. Comfort; René E. Grossman; William E. Hiller

[57] ABSTRACT

A magnetic domain memory including bubble operated access elements for non-destructively reading the memory, for erasing bubbles from the memory and for writing new data into the memory. The access elements comprise retrograde transient bubble switches, exclusive merge elements, disjoint crossover elements and bubble generators, all of which are all-bubble logic elements.

12 Claims, 10 Drawing Figures

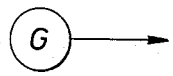
FIG. 1
PRIOR ART
BUBBLE GENERATOR
FIG. 2
PRIOR ART
BUBBLE ANNIHILATOR
FIG. 3
PRIOR ART
TRANSIENT BUBBLE SWITCH
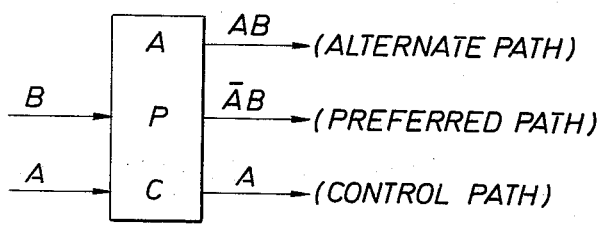
FIG. 4
PRIOR ART
RETROGRADE TRANSIENT BUBBLE SWITCH
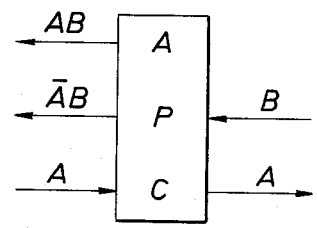
FIG. 5
PRIOR ART
EXCLUSIVE MERGE
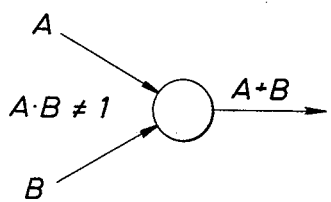
FIG. 6
PRIOR ART
DISJOINT CROSSOVER
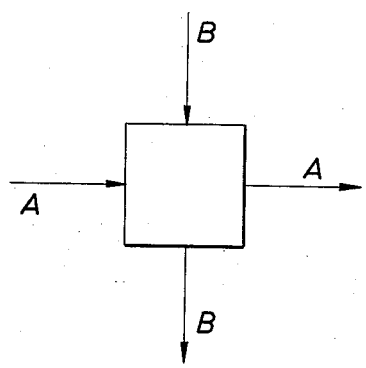

MAGNETIC DOMAIN MEMORY EMPLOYING ALL-BUBBLE LOGIC ELEMENTS

BACKGROUND OF THE INVENTION

1. Field of the Invention

This invention relates to magnetic domain memory circuits and particularly to interrogating and writing into such memory circuits using magnetic domain logic elements.

2. Description of the Prior Art

Recently significant interests have developed in a class of magnetic devices known generically as magnetic or "bubble" domain devices. Such devices described, for example, in IEEE Transactions on Magnetics, Vol. MAG.-5, No. 3 (1969) pp. 544-553, "Application of Orthoferrites to Domain-Wall Devices", are generally planar in configuration and are constructed of materials which have magnetically easy directions essentially perpendicular to the plane of the structure. Magnetic properties, e.g., magnetization anisotropy, coercivity, mobility, are such that the device may be maintained magnetically saturated with magnitization in a direction out of the plane and that single domain small localized regions of polarization aligned opposite to the general polarization direction may be supported. Such localized regions, which are generally cylindrical in configuration, represent memory bits. Interest in devices of this nature is, in large part, based on high density and the ability of the cylindrical magnetic domain to be independent of the boundary of the magnetic material in the plane in which it is formed and hence capable of moving anywhere in the plane of the magnetic material to effect various logic operations.

The bubbles can be manipulated by programming currents through a pattern of conductors positioned adjacent the magnetic material or by varying the surrounding magnetic field. As an example, the magnetic domains or bubbles may be formed in thin platelets having uniaxial anisotropy with the easy magnetic axis perpendicular to the plate comprising such material as rare earth orthoferrite and rare earth aluminum and gallium substituted iron garnets. Since the magnetic bubbles can be propagated, erased, replicated, and manipulated to form logic operations and their presence and absence detected, these bubbles may be utilized to perform many of the on-off or primary functions vital to computer operation.

Magnetic bubble memory systems offer significant advantages since logic, memory, counting and switching may all be performed within a single layer of solid magnetic material. This is in contrast to conventional memory systems in which information must move from one device to another through interconnecting conductors and high gain amplifiers. The magnetic bubbles representing the data move in a plane of thin sheets of magnetic material such as orthoferrite crystals, for example, and they can be shifted into precisely defined positions at high speed with little energy. The magnetic material itself remains stationary. With the advent of mixed rare earth aluminum or gallium substituted iron garnets which are capable of providing bit density in the order of $10^6$ per square inch, the development of a reliable solid state material memory equivalent of magnetic disc file or drums has become a particularly attractive and realistic concept.

Many organizations of operatable domains have been disclosed. One of the most popular is the major-minor memory organization disclosed in U.S. Pat. No. 3,618,054 of P. I. Bonyhard, U. F. Gianola, and A. J. Perneski. The major-minor memory organization as well as its implementation and operation is now well known in the art. Other memory organizations, including non-closed loop organizations, are also well known.

Typically, a memory organization is established by an arrangement of T and bar permalloy circuits on an orthoferrite platelet. The bubbles circularly propagate around the loop by inplane rotating magnetic field action. Access to an organization is normally performed through detect and read connections thereto and by write connections. The connections include a transfer conducting line for application of an external electrical pulse to cause a transfer of bubble data to and from the loop, as desired.

Therefore, even though the memory unit includes a plurality of individual logic storage registers, the manipulative operations are electronic. Hence, heretofore there has not been an all-bubble memory system wherein the manipulative as well as the storage operations are performed using magnetic domain operative elements.

Accordingly, it is a feature of the present invention to provide an improved accessing of a bubble logic storage register for reading the bubble logic therefrom using all-bubble read-out elements.

Another feature of the present invention is to provide an improved accessing of a bubble logic storage register for writing new bubble logic therein using all-bubble write elements.

Yet another feature of the present invention is to provide an improved accessing of a bubble logic storage register for erasing bubbles therefrom using all-bubble erase elements.

Still another feature of the present invention is to provide an improved accessing of a plurality of bubble logic storage register for reading out bubbles therefrom to a common output data stream and for erasing and writing bubbles therein from a common input data stream.

SUMMARY OF THE INVENTION

A preferred embodiment of the present invention includes a body of magnetic material capable of supporting magnetic domains, the material being arranged for the performance of a logic register, typically a closed loop. A periodic drive means, such as a rotating magnetic field, periodically moves or propagates bubbles along the path of the register. Two transient bubble switches and related components are used as read-out access elements. One switch is connected with its control path in the register and its preferred path to receive an interrogate bubble. The other switch is connected with its preferred path to a buble generator. With two merge elements, the interrogate bubble non-destructively reads the bubbles in the register and applies them to a common output data stream in serial fashion. In similar fashion, erase elements including a transient bubble switch is used to remove bubbles from the register in response to an erase bubble control signal to permit new data to be written in via a transient switch to which an input data stream is applied together with a write control signal connection.

A plurality of registers may be operated serially using the same read erase and write control signals, all these signals being in the form of bubbles.

BRIEF DESCRIPTION OF THE DRAWINGS

So that the manner in which the above-recited features, advantages and objects of the invention, as well as others which will become apparent, are attained and can be understood in detail, more particular description of the invention briefly summarized above may be had by reference to the embodiments thereof which are illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

In the Drawings:

FIG. 1 is a schematic diagram of a bubble generator known in the prior art and employed as a logic element in a magnetic domain structure in accordance with the present invention.

FIG. 2 is a schematic diagram of a bubble annihilator known in the prior art and employed as a logic element in a magnetic domain structure in accordance with the present invention.

FIG. 3 is a schematic diagram of a transient bubble switch known in the prior art and employed as a logic element in a magnetic domain structure in accordance with the present invention.

FIG. 4 is a schematic diagram of a retrograde transient bubble switch known in the prior art and employed as a logic element in a magnetic domain structure in accordance with the present invention.

FIG. 5 is a schematic diagram of an exclusive merge element known in the prior art and employed as a logic element in a magnetic domain structure in accordance with the present invention.

FIG. 6 is a schematic diagram of a disjoint crossover element known in the prior art and employed as a logic element in a magnetic domain structure in accordance with the present invention.

DESCRIPTION OF PREFERRED EMBODIMENTS

For purposes herein, a systematic designation has been employed with respect to the logic elements to illustrate the movement of domains from place to place and to facilitate a more complete understanding of the illustrated embodiment of the invention. FIG. 1 illustrates a bubble generator, which produces a predetermined number of bubbles in a unit of time. This time is synchronous with the cyclical processing time of the bubbles in the data bits. That is, each time a data bit is processed a step along its path, a bubble is produced from a bubble generator. Similarly, FIG. 2 illustrates the annihilation of all bubbles applied thereto.

FIG. 3 illustrates an element referred to as a transient bubble switch, such as that shown in FIG. 4 of U.S. Pat. No. 3,750,106, which is incorporated herein by reference. There are three main sections of this switch: the control path, designated C; the preferred path, designated P; and the alternate path, designated A. There are two inputs, one each for receiving data logic streams A and B. As illustrated, data stream A is applied to the control path and data stream B is applied to the preferred path.

Either bubbles (indicative of logic one) or voids (indicative of logic zero) in data stream A will pass through control path C to appear at the output. Should data A be a void, then the bubble or void appearing in data stream B will pass along the preferred path to appear at the output. On the other hand, should data stream A have a bubble in the control path while data stream B has a bubble, the bubble in data stream B is forced to alternate path A to appear at the output thereof, while a void will appear at the output of preferred path P. Hence, the output of alternate path A is logic AB (A and B) and the output of preferred path P is logic $\overline{A}B$ (NOT A or inverted A AND B).

FIG. 4 illustrates a retrograde transient bubble switch. This switch is identical to the switch illustrated in FIG. 3 except that input bubbles B are applied to the switch from the opposite direction. However, the operation is identical with the FIG. 3 switch in that the presence of a bubble A in control path C causes bubble B to exit at alternate path A. A bubble void in the control path causes bubble B to exit at preferred path P.

FIG. 5 illustrates an exclusive merge gate. That is, the gate reduces the paths of two data streams down to one provided that the merge gate is not presented a bubble from each data stream simultaneously. Or, in logic terminology, the gate produces A + B so long as AB $\neq$ 1.

FIG. 6 presents a disjoint crossover gate, which merely allows a bubble as input A to continue through the gate to appear as output A and allows a bubble as input B to continue through the gate to appear as output B. The gate permits this operation even though bubbles A and B may occur in the gate simultaneously.

Figure 7:
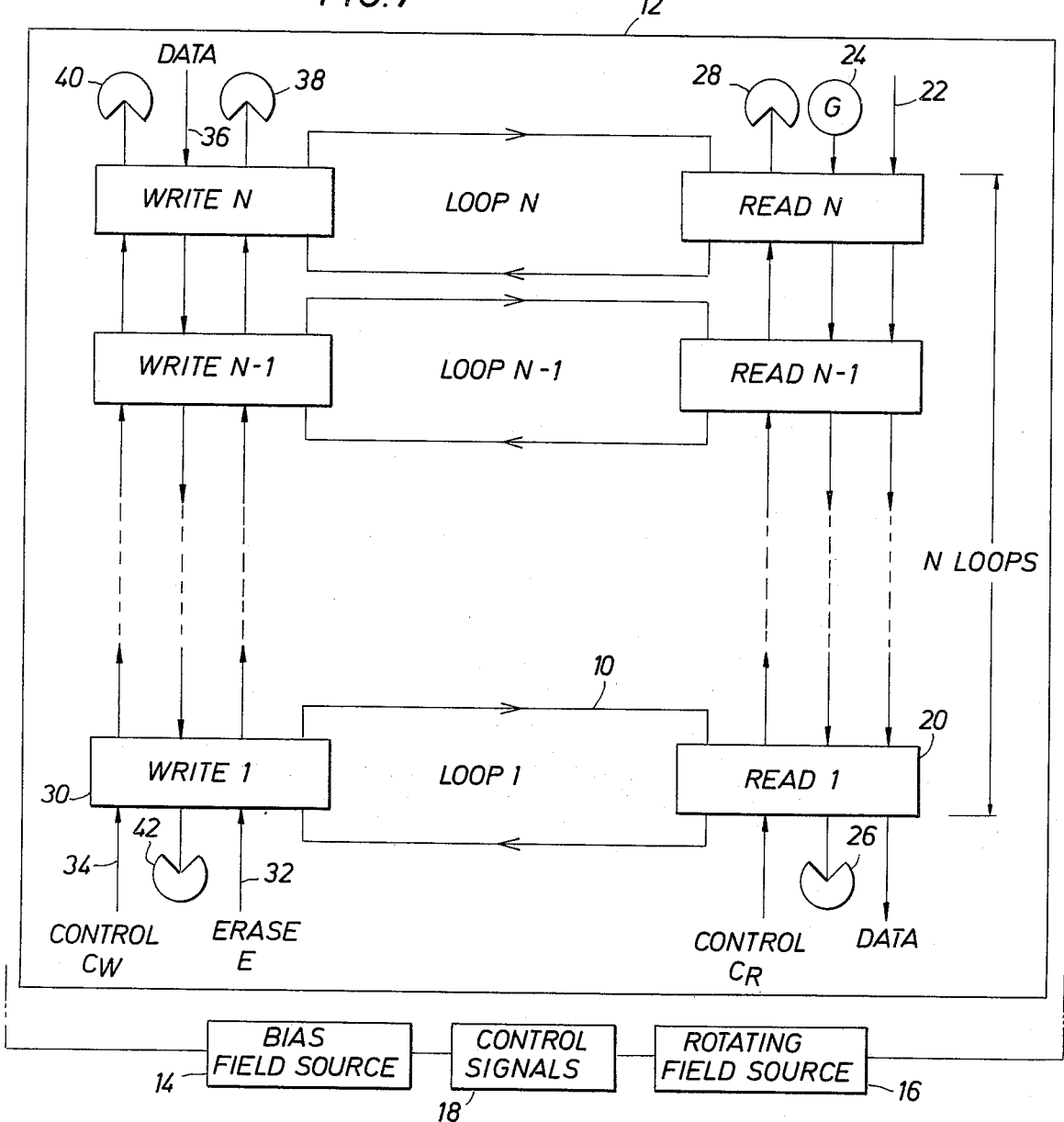
FIG. 7 is a schematic diagram of a preferred embodiment of the present invention wherein all-bubble logic elements are employed.

Now referring to FIG. 7, a magnetic memory employing multiple register data loops 10 is shown. Data is stored and manipulated in these registers through the presence of bubbles (logic one) and bubble voids (logic zero). The loops are numbered for convenience beginning with loop 1 and progressing from bottom to top to loop N. The loops are supported by a body of magnetic material secured adjacent one surface of a platelet or semi-conductor substrate 12. In conventional manner, bias field source 14 and rotating field source 16 provide means coupled to the body for progressively moving magnetic domains around the loops concurrently in step fashion. Typically, a domain moves through one progression each full turn of the rotating field. Control signals 18, to be detailed hereinafter, are also coordinated with the field sources.

Each of the register loops 10 is connected to two access elements. One of these elements is read means 20. Again for convenience, loop 1 is connected to read means 1 and loop N is connected to read means N. Each of the respective loops in between 1 and N is connected to a corresponding read means. The details of read means 20 is given hereinafter. However, note that a common output data stream 22 containing serial digital data in the form of bubbles and bubble voids is applied to read means N, the data stream being consecutively connected through each of the intervening read means, finally exiting from read means 1. Likewise, generator 24 supplies bubbles to read means N at each timing step of the field sources. Consecutively, bubbles are supplied from read means N to read means N-1 and finally read means 1, to be annihilated by annihilator 26.

Finally, in reverse fashion, control signals $C_R$ in the form of interrogate bubbles are applied to read means 1 and then successively to intervening read means through read means N. Control bubbles exiting from read means N are annihilated in annihilator 28. Each interrogate bubble causes interrogation of each of the loops as it passes through the access element related thereto.

It should be noted that the progression of bubbles in each of the respective loops is in a clockwise direction. The bubbles in the output data stream as it passes the loops along the right hand sides thereof are progressing in the same direction as the data bubbles within the loops. The bubbles in control signal $C_R$ are progressing in the opposite direction to the data movement in the loops.

Also connected to each of the respective loops is another access element. These are write means 1 through write means N 30 connected respectively to loops 1 though N. Write means 1 is connected to loop 1 and has applied to it two control signals in the form of applied operate bubbles. Erase bubbles E in stream 32 are applied progressively beginning with write means 1 through write means N. In the same direction, write control bubbles $C_W$ in stream 34 are applied beginning with write means 1 through write means N. An erase bubble appearing in a write means causes a data bubble concurrently present therewith to be removed from the loop to which the write means is connected.

A data stream 36 is applied to write means N to progressively pass therefrom through the intervening write means, finally passing through write means 1. Annihilator 38 annihilates the erase bubbles exiting from write means N. Annihilator 40 annihilates the control $C_W$ bubbles exiting from write means N. Annihilator 42 annihilates the bubbles in the data stream exiting from write means 1.

Figure 8:
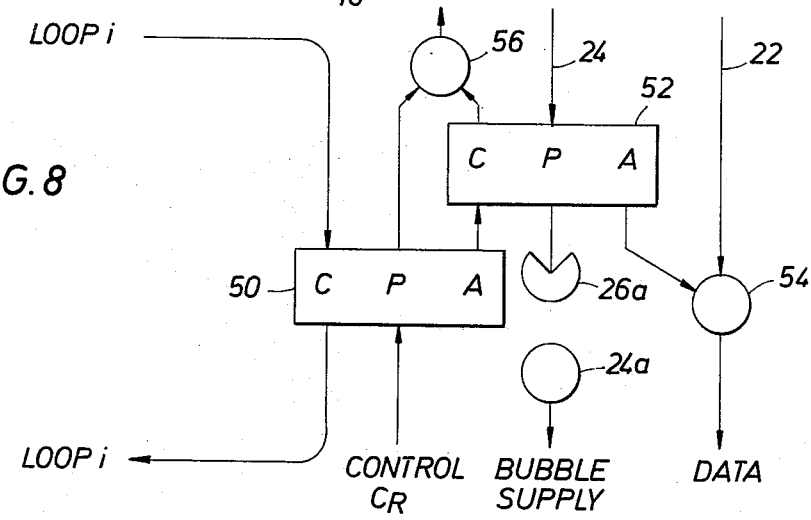
FIG. 8 is a schematic diagram of the read-out elements included in a preferred embodiment of this present invention.

Now referring to FIG. 8, a detailed representation of a read means is illustrated. The read means includes two transient bubble switches 50 and 52. Switch 50 is connected to loop $i$ so that the loop passes through the control path thereof. Control bubbles $C_R$ are applied to the preferred path input and the alternate path output is applied to the input of the control path of switch 52.

Switch 52 receives the generated bubble supply at its preferred path input. The output of the preferred path is applied to annihilator 26a. The alternate path output of switch 52 is connected to exclusive merge element 54 along with the output data stream. Note that both switches 50 and 52 are retrograde switches.

The output of the control path of switch 52 is connected to exclusive merge element 56 along with the output of the preferred path of switch 50. A new generator 24a generates supply bubbles for the subsequent read means. Alternatively, the unused bubbles from read means can be fed directly into the bubble supply of the subsequent read means in which case the bubble annihilator 26a and the bubble generator 24a would be eliminated from the system of FIG. 8. In the latter instance, the bubbles supplied by a single bubble generator 24 would be sufficient to provide the entire bubble supply, since the control bubble $C_R$ is always presented with a full bubble supply as it progresses successively through each read means.

In operation of a read means, a control bubble appearing in switch 50 concurrently with a bubble in the loop will cause an output from the alternate path switch 50 to be applied to the control path of switch 52. This causes a bubble in supply line 24 to be diverted in the switch to exit from the alternate path of switch 52 to merge element 54. An absence of a bubble in the loop will not deter a control bubble applied to the preferred path of switch 50. Therefore, it will progress through to merge element 56. There will be no data bubble applied from switch 52 to the data stream at merge element 54.

The net result is that bubbles in loop $i$ are non-destructively detected. Voids result in no additional bubbles inserted in the data stream. The control signal progresses through all of the related read means regardless of the presence of data bubbles in the loop. Bubbles in the output data stream progress through merge elements 54 together with the application of bubbles from switch 52.

Note that the output bubbles are spaced at twice the distance of the bubbles in loop $i$ because of the presence of two switches within the read means.

Figure 9:
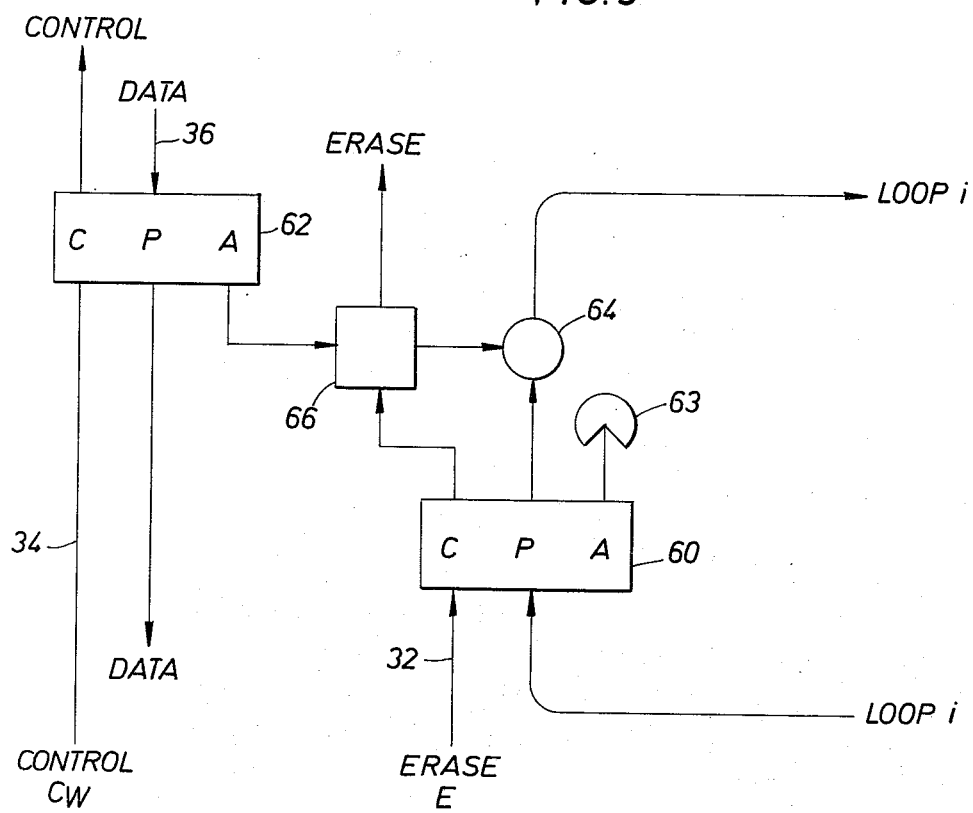
FIG. 9 is a schematic diagram of the erase and write elements included in a preferred embodiment of the present invention.

In similar fashion, new data may be written into loop $i$, as shown in FIG. 9. The write means, including the erase function, comprises two transient bubble switches 60 and 62 and associated components. Switch 60 is connected to loop $i$ so that the loop passes through its preferred path. The alternate path of switch 60 is connected to annihilator 63 and the output of the preferred path is connected to exclusive merge element 64. The input to the control path of switch 60 is erase signal 32 in the form of bubbles.

The input to the control path of switch 62 are write bubbles $C_W$. Input data stream 36 is applied to the preferred path of switch 62 and the alternate path output of switch 62 is connected through disjoint crossover 66 to be applied to merge element 64. The output of the control path of switch 60 passes through crossover 66 to progress to the next succeeding write means.

An erase bubble appearing in the control path of switch 60 will cause a data bubble in loop $i$ to exit from the alternate path of switch 60 to be annihilated at annihilator 63. If there is no erase bubble in the control path of switch 60, bubbles in loop $i$ progress through merge element 64 to continue circulation in the loop. An erase bubble exiting from switch 60 will progress through crossover 66 to be applied to the next write means.

When it is desired to write a data bubble from input data stream 36, a signal is applied on control signal 34 to cause the data bubble to exit from the alternate path of switch 62, through crossover 66 to be applied at merge element 64 to loop $i$. The coordination of the erase function and the write function will insure that the loop is emptied of all data and new data is supplied thereto. Also once a bubble is removed from the input data stream, it is no longer available to be written into a subsequent loop.

As with the read operation, the loop address access time is determined by the time that the write and erase bubbles are sent relative to loop rotation. Additionally, the data to be written must be synchronized with rotation of the loops.

Figure 10:
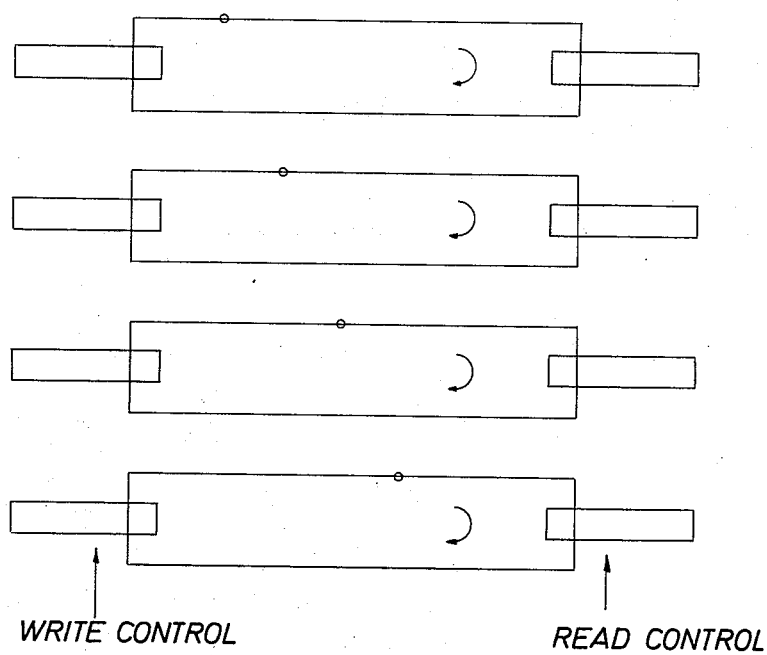
FIG. 10 is a schematic diagram of the storage of data in a plurality of related bubble registers when accessed according to the present invention for purposes of read-out, erasing and writing of data.

FIG. 10 illustrates that individual bit bubbles of a word are stored in the successive loops in a staggered fashion, rather than one being directly above another as in the major-minor loop arrangement in the prior art.

This is because the accessing is done progressively rather than simultaneously.

Although the discussion has been with regard to registers in the form of closed loops, any register, such as the G-loop register which is shown in copending patent application Ser. No. 429,260, filed Dec. 28, 1973, now U.S. Pat. No. 3,838,407 issued Sept. 24, 1974, may be employed with the write means and read means which are disclosed above.

While particular embodiments of the invention have been shown, it will be understood that the invention is not limited thereto, since many modifications may be made and will become apparent to those skilled in the art.

What is claimed is:

1. A magnetic memory, comprising:
   a substrate,
   a body of magnetic material capable of supporting magnetic domains secured adjacent one surface of said substrate, said magnetic domains being organized into a logic register,
   means coupled to said body for generating and controllably positioning magnetic domains in said magnetic material in step fashion,
   magnetic domain read means connected to said register for non-destructively interrogating said register, said read means including
   a first transient bubble switch having its control path connected to said register and its preferred path input connected to receive an interrogate bubble,
   a second transient bubble switch having its control path input connected to the output of the alternate path of said first switch, and
   a bubble generator connected to the preferred path input of said second switch,
   said first switch being responsive to the simultaneous presence of a bubble from said register in its control path and an interrogate bubble in its preferred path for directing said interrogate bubble to exit from its alternate path, and
   said second switch being responsive to the simultaneous presence of a bubble from the alternate path of said first switch in its control path and a bubble from said generator in its preferred path for directing the bubble from said generator to exit from its alternate path.

2. A magnetic memory, comprising:
   a substrate,
   a body of magnetic material capable of supporting magnetic domains secured adjacent one surface of said substrate, said magnetic domains being organized into a logic register,
   means coupled to said body for generating and controllably positioning magnetic domains in said magnetic material in step fashion,
   magnetic domain read means connected to said register for non-destructively interrogating said register, said read means including
   a first transient bubble switch having its control path connected to said register and its preferred path input connected to receive an interrogate bubble,
   a second transient bubble switch having its control path input connected to the output of the alternate path of said first switch, and
   a bubble generator connected to the preferred path input of said second switch, a bubble in said register causing said interrogate bubble to exit from the alternate path of said first switch and thereby cause a bubble from said generator to exit from said alternate path of said second switch,
   said first and second transient bubble switches being retrograde switches, and the direction of bubble movement in said register and from said generator being opposite to the movement of said interrogate bubble.

3. A magnetic memory as described in claim 2, and including
   a first exclusive merge element connected to the output of the preferred path of said first switch and to the output of the control path of said second switch, the output from said merge element being said interrogate bubble, and
   a second exclusive merge element connected to the output of the alternate path of said second switch and to a common output data stream so as to apply detected register data onto said data stream in serial fashion.

4. A magnetic memory as described in claim 3, and including
   at least a second body of magnetic material capable of supporting magnetic domains secured adjacent one surface of said substrate organized into a second register,
   said generating and positioning means coupled to said second body, and
   second magnetic read means connected to said second register for non-destructively interrogating said second register, said second read means including
   a third transient bubble switch having its control path connected to said second register and its preferred path input connected to receive said interrogate bubble from said first merge element,
   a fourth transient bubble switch having its control path input connected to the output of the alternate path of said third switch, and
   a second bubble generator connected to the preferred path input of said fourth switch, a bubble in said second register causing said interrogate bubble to exit from the alternate path of said third switch and thereby cause a bubble from said generator to exit from said alternate path of said fourth switch.

5. A magnetic memory as described in claim 4, and including a third exclusive merge element connected to the output of the alternate path of said fourth switch and to said common output data stream so as to apply data detected from said second register onto said output data stream in serial fashion.

6. A magnetic memory, comprising:
   a substrate,
   a body of magnetic material capable of supporting magnetic domains secured adjacent one surface of said substrate, said magnetic domains being organized into a logic register,
   means coupled to said body for generating and controllably positioning magnetic domains in said magnetic material in step fashion,
   magnetic domain read means connected to said register for non-destructively interrogating said register, said read means including
   a first transient bubble switch having its control path connected to said register and its preferred path input connected to receive an interrogate bubble, a second transient bubble switch having its control path input connected to the output of the alternate path of said first switch, and a bubble generator connected to the preferred path input of said second switch, a bubble in said register causing said interrogate bubble to exit from the alternate path of said first switch and thereby cause a bubble from said generator to exit from said alternate path of said second switch, and magnetic domain write means connected to said register for writing bubble data into said register from a common input data stream, said write means including a third transient bubble switch having its preferred path connected to said input data stream and its control path input connected to receive a write bubble, and an exclusive merge element connected to said register and to the alternate path output of said third switch, a bubble in said input data stream arriving simultaneously in said third switch with a write bubble causing a bubble to be inserted at said merge element into a bubble void location in said register.

7. A magnetic memory as described in claim 6, and including a fourth transient bubble switch having its preferred path connected in said register preceding said merge element, its control path input connected to receive an erase bubble, an erase bubble causing removal of a bubble from said register thereby creating a bubble void location in said register.

8. A magnetic memory as described in claim 7, and including at least a second body of magnetic material capable of supporting magnetic domains secured adjacent one surface of said substrate organized into a second register, said generating and positioning means coupled to said second body, and second magnetic write means connected to said second register for writing bubble data into said second register from said common input data stream, including a fifth transient bubble switch having its preferred path connected to said input data stream and its control path input connected to receive said write bubble following passage through said third transient switch, a second exclusive merge element connected to said second register and to the alternate path output of said fifth switch, a disjoint crossover element connected to the output of the control path of said fourth switch to pass said erase bubble and to permit the output of the alternate path of said third switch to said first merge element, and a sixth transient bubble switch having its preferred path connected to said second register preceding said second merge element, its control path input connected to receive said erase bubble from said crossover element, a bubble in said input data stream arriving simultaneously in said fifth switch with a write bubble causing a bubble to be inserted at said second merge element into a bubble void location in said second register, an erase bubble causing removal of a bubble from said second register thereby creating a bubble void location in said second register.

9. A magnetic memory, comprising:

a substrate, a body of magnetic material capable of supporting magnetic domains secured adjacent one surface of said substrate, said magnetic domains being organized into a register, means coupled to said body for generating and controllably positioning magnetic domains in said magnetic material in step fashion, magnetic domain write means connected to said register for writing bubble data into said register from a common input data stream, said write means including a transient bubble switch having its preferred path connected to said input data stream and its control path input connected to receive a write bubble, and an exclusive merge element connected to said register into the alternate path output of said switch, said switch being responsive to the simultaneous presence of a bubble from said input data stream in its preferred path and a write bubble in its control path for directing said data bubble to exit from its alternate path, and said exclusive merge element being responsive to the reception of said data bubble from the alternate path of said switch to insert a bubble into a bubble void location in said register.

10. A magnetic memory as described in claim 9, wherein said transient switch is a retrograde switch, the direction of write bubble movement and the direction of bubbles in said common input data stream being opposite.

11. A magnetic memory, comprising:

a substrate, a body of magnetic material capable of supporting magnetic domains secured adjacent one surface of said substrate, said magnetic domains being organized into a register, means coupled to said body for generating and controllably positioning magnetic domains in said magnetic material in step fashion, magnetic domain write means connected to said register for writing bubble data into said register from a common input data stream, said write means including a first transient bubble switch having its preferred path connected to said input data stream and its control path input connected to receive a write bubble, an exclusive merge element connected to said register into the alternate path output of said first switch, a bubble in said input data stream arriving simultaneously in said first switch with a write bubble causing a bubble to be inserted at said merge element into a bubble void location in said register, and a second transient bubble switch having its preferred path connected in said register preceding said merge element, its control path input connected to receive an erase bubble, an erase bubble causing removal of a bubble from said register thereby creating a bubble void location in said register.

12. A magnetic memory, comprising:

a substrate, a first body of magnetic material capable of supporting magnetic domains secured adjacent one surface of said substrate, said magnetic domains being organized into a first register, means coupled to said first body for generating and controllably positioning magnetic domains in said magnetic material in step fashion, first magnetic domain write means connected to said first register for writing bubble data into said first register from a common input data stream, said first write means including a first transient bubble switch having its preferred path connected to said input data stream and its control path input connected to receive a write bubble, a first exclusive merge element connected to said first register into the alternate path output of said first switch, a bubble in said input data stream arriving simultaneously in said first switch with a write bubble causing a bubble to be inserted at said first merge element into a bubble void location in said first register, and a second transient bubble switch having its preferred path connected in said first register preceding said first merge element, its control path input connected to receive an erase bubble, an erase bubble causing removal of a bubble from said first register thereby creating a bubble void location in said first register;

at least a second body of magnetic material capable of supporting magnetic domains secured adjacent one surface of said substrate, said magnetic domains of said second body being organized into a second register, said generating and positioning means being coupled to said second body, and second magnetic domain write means connected to said second register for writing bubble data into said second register from said common input data stream, said second write means including a third transient bubble switch having its preferred path connected to said input data stream and its control path input connected to receive said write bubble following passage through said first transient switch, a second exclusive merge element connected to said second register and to the alternate path output of said third switch, a disjoint crossover element connected to the output of the control path of said second switch to pass said erase bubble and to permit the output of the alternate path of said first switch to said first merge element, and a fourth transient bubble switch having its preferred path connected to said second register preceding said second merge element, its control path input connected to receive said erase bubble from said crossover element, a bubble in said input data stream arriving simultaneously in said third switch with a write bubble causing a bubble to be inserted at said second merge element into a bubble void location in said second register, an erase bubble causing removal of a bubble from said second register thereby creating a bubble void location in said second register.

* * * * *